United States Patent [19]

Hamaguchi et al.

[11] Patent Number: 4,874,664

[45] Date of Patent: Oct. 17, 1989

[54] BIREFRINGENT PLATE AND MANUFACTURING METHOD FOR THE SAME

[75] Inventors: Shigeki Hamaguchi, Aichi; Yasuhiro Ohtsuka, Toyota; Tomoyoshi Motohiro, Seto; Yasunori Taga, Nagoya; Masahiko Ishii, Aichi, all of Japan

[73] Assignees: Toyota Jidosha Kabushiki Kaisha; Kabushiki Kaisha Toyota Chuo Kenkyusho, both of Aichi, Japan

[21] Appl. No.: 118,932

[22] Filed: Nov. 10, 1987

[30] Foreign Application Priority Data

Nov. 21, 1986 [JP] Japan .................................. 61-278981
Nov. 25, 1986 [JP] Japan .................................. 61-280114

[51] Int. Cl.$^4$ ........................... G02B 5/30; G02B 1/10
[52] U.S. Cl. ................................. 428/325; 428/428; 428/432; 428/701
[58] Field of Search ................ 428/325, 323, 330, 331, 428/432, 446, 426–428, 698–701, 702

[56] References Cited

U.S. PATENT DOCUMENTS 4,690,861 9/1987 Nakamura et al. .............. 428/701 X
4,702,955 10/1987 Allred et al. ...................... 428/701 X

FOREIGN PATENT DOCUMENTS 56-94520 7/1981 Japan .
57-20929 2/1982 Japan .
57-143731 9/1982 Japan .
59-49508 3/1984 Japan .
59-56718 4/1984 Japan .

OTHER PUBLICATIONS

Philips Tech Rev. vol. 27, 1966, pp. 87–91, 1966. "Microfractography of Thin Films", J. M. Nieuwenhuizen and H. B. Haanstra.
Applied Physics Letters, vol. 26, No. 11, Jun. 1, 1975, pp. 598–600, "Birefringence in Silicon Monoxide Films Used for Aligning Liquid Crystal Layers", W. A. Crossland.
IEEE Transactions on Electron Devices, Jul. 1977, pp. 795–804, "Topography of Obliquely Evaporated Silicon Oxide Films and its Effect on Liquid-Crystal Orientation", Lawrence A. Goodman et al.
J. Opt. Am. 73, Aug. 8, 1987, p. 1871, "MO7. Birefringence in Optical Coatings" J. Hodgkinson et al.
J. Vac. Sci. Technol. A, vol. 4, No. 3, May/Jun. 1986, pp. 418–422, "Structure-Related Optical Properties of Thin Films," H. Angus Macleod.

Primary Examiner—Nancy Swisher
Attorney, Agent, or Firm—Finnegan, Henderson, Farabow, Garrett, Dunner

[57] ABSTRACT

A birefringent plate comprising a transparent substrate and an obliquely evaporated film formed on the transparent substrate, is free from the visual angle dependence because the obliquely evaporated film is formed into a multilayer composition and the neighboring layers have a different evaporation direction. Moreover, a manufacturing method for the birefringent plate, using a device constituted of a vacuum chamber and a crucible having a large number of inclined through holes, is capable of making the film thickness of the obliquely evaporated film uniform.

6 Claims, 4 Drawing Sheets

BIREFRINGENT PLATE AND MANUFACTURING METHOD FOR THE SAME

BACKGROUND OF THE INVENTION

1. Field of the Invention

This invention relates to a birefringent plate using an obliquely evaporated film and a manufacturing method for the same.

2. Discussion of the Background

Heretoforem, there has been known a birefringent plate having an obliquely evaporated film made of a dielectric material formed on a substrate. This birefringent plate has been manufactured by a vacuum film forming method such as a vacuum evaporation method, where columnar structure of the dielectric material are obliquely grown on the substrate surface disposed obliquely to the direction of the dielectric material (evaporation material) flying from an evaporation source. Thus obtained obliquely evaporated film has been useful for optical function devices such as a quarter wavelength (λ) plate and the like because the film has birefringence to an incident light. However, there has been a defect that the applications of the optical function devices using birefringence of the obliquely evaporated fiom are restricted by their visual angle dependence. That is, as shown in FIG. 4, an obliquely evaporated film 1 made of the dielectric material has columnar structure growing obliquely on the surface of a substrate 2. Therefore, the obliquely evaporated film 1 exhibits relatively large birefringence to the incident light from the direction (a). However, the birefringence becomes small when the direction of the incident light is changed from (a) to (b) or (c). Whether the birefringence becomes large or small depends on the direction of the incident light (visual angle). Further, it has been difficult to obtain uniform thickness of the obliquely evaporated film by the method in which the substrate is disposed obliquely to the direction of the dielectric material flying from the evaporation source. That is, as shown in FIG. 2, the obliquely evaporated film has been formed on the substrate 2 by holding the substrate 2 at an angle θ to and at some distance away from a crucible 17 (evaporation source). The crucible 17 is placed horizontally in the lower part of a vacuum chamber 9. Accordingly, the film thickness has tended to be large on the portion of the substrate surface much closer to the crucible 17 due to the distance difference between the portions of the substrate surface and the crucible 17. Also, to keep some distance between the substrate 2 and the crucible 17 has required a large-sized device which takes much time to evacuate air from the chamber 9 with low deposition rate.

SUMMARY OF THE INVENTION

Accordingly, it is an object of the present invention to provide a birefringent plate free from the visual angle dependence.

It is another object of the present invention to provide a manufacturing method for the birefrigent plate capable of achieving uniform film thickness of the obliquely evaporated film by a small-sized device.

The birefringent plate of this invention comprises a transparent substrate and obliquely evaporated films formed thereon by evaporating the dielectric material obliquely to the normal of the substrate. The obliquely evaporated film is composed of at least two layers and the two neighboring layers have a different growing direction of columnar structure. That is, birefringence always occurs to the incident light in either one of neighboring layers because large birefringence can be attained by one of layers even if only small birefringence is attained by the other layer. Thereby, the obliquely evaporated film of this invention is free from the visual angle dependence. If the growing directions of columnar structure of the two neighboring layers are symmetrical with respect to the normal of the substrate, the restriction of the visual angle dependence can be eliminated more favorably. For example, in the two-layer composition, the growing direction of columnar structure of the first layer is inclined by the angle which is determined by θ to the normal of the substrate, and the growing direction of columnar structure of the second layer is inclined by the angle in the opposite direction to the growing direction of columnar structure of the first layer. That is, when forming the second layer, the substrate is inclined in the opposite direction to the inclined direction when forming the first layer. Thus, the distance between the evaporation source and the portions of the substrate surface becomes uniform when the second layer is formed on the first layer. Thereby, a birefringent plate with uniform film thickness can be obtained.

Film thickness, materials and an evaporation angle of the layers of an obliquely evaporated film depend on the retardation of light wave to be caused by the evaporated film. Here, the evaporation angle means an angle between the direction of evaporation material flying from the evaporation source and the normal of the substrate.

For a substrate used of the birefringent plate of this invention, conventionally employed ones can be used. As to the manufacturing method for the birefringent plate of this invention, both the conventional manufacturing method and the manufacturing method of this invention described hereinafter can be used. However, as described above, the conventional manufacturing method requires a large-sized device.

The manufacturing method of this invention for the birefringent plate uses a device as shown in FIG. 9. The device is constituted of a vacuum chamber 9 and a crucible 5 placed therein. A substrate 2 is placed in the upper part of the vacuum chamber 9. In FIG. 9, the crucible 5 has a large number of inclined through holes 6 on the upper cover, so that an evaporation material 100 reaches to the substrate 2 obliquely in the form of vapor 101 from the inclined through holes 6, while the substrate 2 and the crucible 5 are placed in parallel with each other so that the upper part of the crucible 5 sequentially faces to the portions of the substrate surface. Thus, the film of the evaporation material 100 is formed on the substrate as an obliquely evaporated film.

In the present invention, the obliquely evaporated film may be formed into a multilayer composition by varying the evaporation angle of neighboring layers.

In the manufacturing method of this invention, the substrate 2 is placed in parallel with the crucible 5 (evaporation source) and therefore the distance between the portions of the substrate 2 and the crucible 5 becomes equal. Thus, the uniform film thickness can be achieved. Also, it becomes possible to reduce the size of the manufacturing device since the substrate 2 can be placed much closer to the crucible 5 than the device used in the conventional manufacturing method. Moreover, it becomes possible to vary the growing diection of columnar structure of the obliquely evaporated film by varying the inclination of the inclined through holes 6 of the crucible 5. That is, the inclination of the inclined through holes 6 determines the evaporation angle.

Instead of the large number of inclined through holes 6, a large number of slots inclined in the direction perpendicular to the relative movement of the substrate 2 and crucible 5 may be formed on the upper part of the crucible 5.

DETAILED DESCRIPTION OF THE PREFERRED EMBODIMENTS

Now, the birefringent plate of this invention will be described in detail with reference to the following Examples 1 to 3.

EXAMPLE 1

Figure 2:
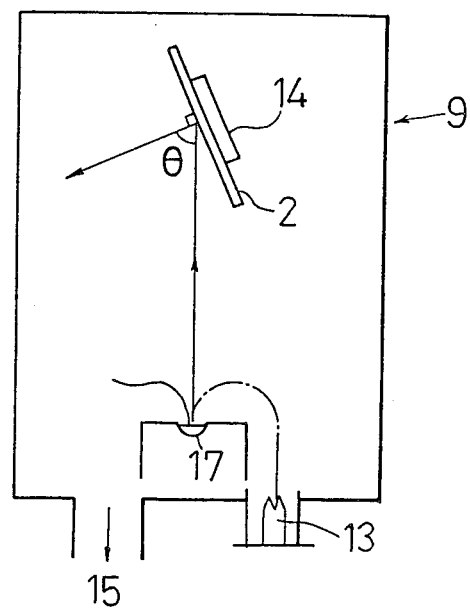
FIG. 2 is an explanatory view of a manufacturing device used by a conventional manufacturing method for a birefringent plate.

In this Example 1, a conventional manufacturing method was used. As shown in FIG. 2, the conventional manufacturing method used a device constituted of a vacuum chamber 9, an electron gun 13, a substrate holder 14 and a crucible 17 (evaporation source). The substrate holder 14 holds a glass substrate 2 on which a dielectric material was evaporated. While, an evacuation system 15 is placed outside the vacuum chamber 9.

Figure 1:
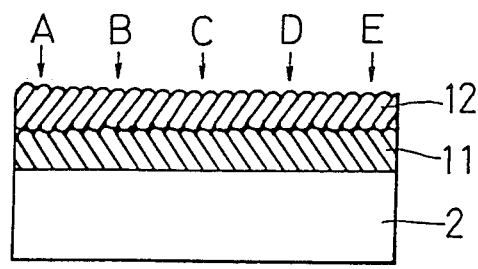
FIG. 1 is a schematic sectional view of a birefringent plate embodying the present invention.

In FIG. 1, first, tungsten oxide ($WO_3$) was evaporated as a lower layer 11 on the glass substrate 2 ($50 \times 250 \times 1.1$ mm) at the evaporation angle of 70°. Then, tungsten oxide was evaporated as an upper layer 12 after varying the evaporation angle to the glass substrate to $-70°$. Thus, a birefringent plate with two layers of the obliquely evaporated film was obtained. FIG. 1 shows thus obtained birefringent plate.

Table shows three kinds of data, i.e., film thickness, phase difference and birefringence or difference between refractive index due to an ordinary light and refractive index due to extraordinary light ($\Delta n$) at positions A, B, C, D and E on the birefringent plate in FIG. 1.

TABLE

| POSITION | A | B | C | D | E |
| --- | --- | --- | --- | --- | --- |
| FILM THICKNESS ($\mu m$) | 2.42 | 2.38 | 2.18 | 2.23 | 2.22 |
| PHASE DIFFERENCE (degree) | 114.46 | 113.24 | 110.00 | 115.51 | 120.36 |
| BIREFRINGENCE ($\Delta n$) | 0.072 | 0.072 | 0.077 | 0.079 | 0.082 |

As can be seen from the Table, birefringence ($\Delta n$) as high as 0.07 to 0.07 were achieved in almost a whole area of the birefringent plate, and the film thickness at each position (A, B, C, D, E) was almost uniform.

Further, transmitting light was examined by interposing the birefringent plate between the crossed nicol polarizer. The examination showed that the transmitting light can be seen at any angle, that is, the visual angle dependence was eliminated favorably. Thus, the birefringent plate free from the visual angle dependence and having uniform film thickness can be obtained by forming two layers with different evaporation angles.

In the above example, tungsten oxide was used as evaporation material, however, the tungsten oxide can be replaced with any material transparent to visible light such as titanium oxide ($TiO_2$), yttria ($Y_2O_3$), tantalum pentoxide ($Ta_2O_5$), niobium pentoxide ($Nb_2O_5$), bismuth trioxide ($Bi_2O_3$), silicon dioxide ($SiO_2$), zinc sulfur (ZnS), molybdenum trioxide ($MoO_3$), cerium dioxide ($CeO_2$), tin dioxide ($SnO_2$) and the like. For example, when the silicon dioxide ($SiO_2$) of 3.4 $\mu m$ overall film thickness is formed on the substrate 2, the same effect as the tungsten oxide can be expected.

While, the obliquely evaporated film can be formed into a multilayer composition, however, film thickness of each layer must be 500 Å or more to ensure sufficient growth of columnar structure in each layer.

Figure 3:
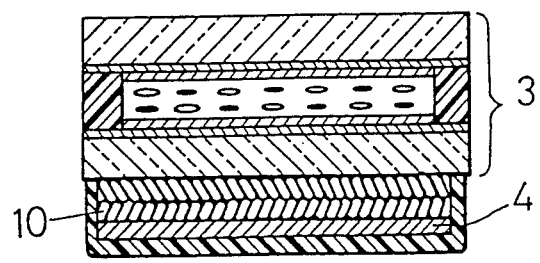
FIG. 3 is a schematic sectional view of a liquid crystal glare shield mirror to which a birefringent plate of this invention is applied.
Figure 4:
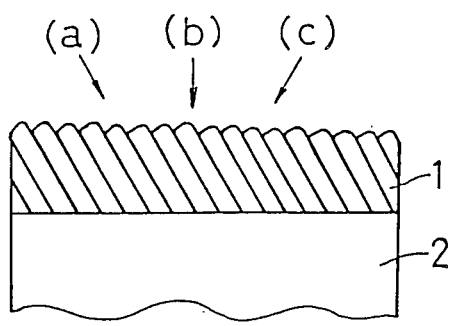
FIG. 4 is a schematic sectional view illustrating a defect of a conventional birefringent plate.

FIG. 3 is a sectional view of birefringent plate applied to a liquid crystal glare shield mirror. The liquid crystal glare shield mirror is constituted of a liquid crystal cell 3, two layers of obliquely evaporated film 10 (phase difference: 90°) and an aluminum reflecting mirror 4. The obliquely evaporated film 10 and reflecting mirror 4 are placed behind the liquid crystal cell 3. The liquid crystal glare shield mirror has the same glare shield performance to any incident light because birefringence occurs twice, namely before and after the reflection on the reflecting mirror. Thus the glare shielding becomes uniform all over the liquid crystal glare shield mirror.

EXAMPLE 2

Figure 5:
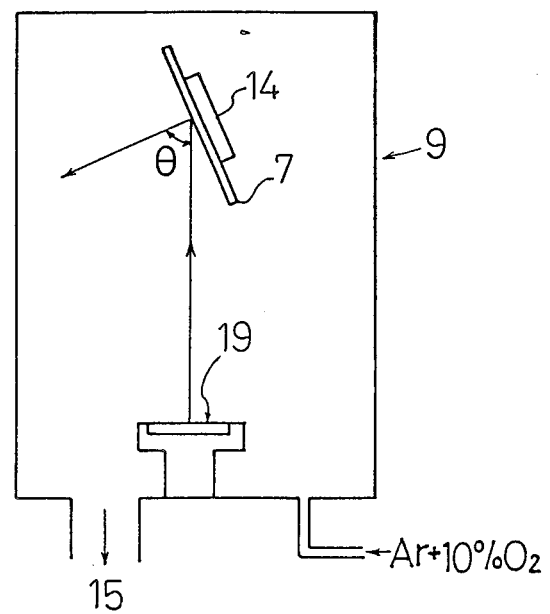
FIG. 5 is an explanatory view of a manufacturing device for a birefringent plate used in Example 2.

In this Example 2, first, tantalum pentoxide was sputtered on the surface of a resin polarizing plate (substrate 7) in an atomsphere of $Ar + 10\% O_2$ by a conventional manufacturing method using a device shown in FIG. 5. In the device, the angle $\theta$ between straight line, connecting both centers of a sputtering target 19 and the substrate 7, and the normal line of the substrate 7 was 70°. And the angle between an intersecting line and the optical axis of the polarizing plate was 45°. The intersecting line means another straight line obtained by intersecting the plane, formed by the straight line mentioned above and the normal of the substrate, with the substrate 7 surface. Under the above circumstances, a film of tantalum pentoxide was formed as a first layer until film thickness of the first layer reached to 1.76 $\mu m$. Next, the substrate 7 was fixed to the position obtained by rotating the substrate 7 at 180° in the same plane, then a film of 1.76 μm thickness was formed on the first layer as a second layer. In this manner, a composite plate with birefringence and polarizing property was obtained. This composite plate had 180°±10° of retardation for visual light in the range of 60×200×3 mm.

Figure 6:
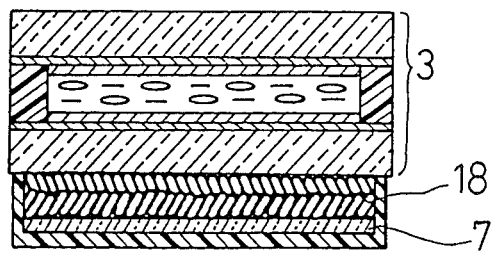
FIG. 6 is a schematic sectional view of a birefringent plate of Example 2.

FIG. 6 is a sectional view showing the composite plate with birefringence and polarizing property applied to a liquid crystal aperture for adjusting light. The liquid crystal aperture for adjusting light comprises a composite plate (a substrate 7 and two layers of obliquely evaporated film 18) and a guest-host type liquid crystal cell 3. The composite plate was placed behind the guest-host type liquid crystal cell 3.

Figure 7:
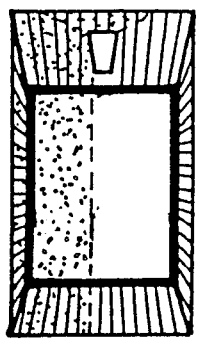
FIG. 7(a) and FIG. 7(b) are explanatory views of a room with a skylight seen from the top.
Figure 7:
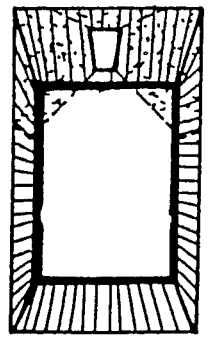

FIG. 7 is a view seen from the top illustrating a small room of about 5 m² where the liquid crystal aperture for adjusting light was used as a skylight. In FIG. 7 (a), the liquid crystal aperture for adjusting light comprising a one-layer type obliquely evaporated film was used. In this case, the outdoor daylight shone mainly on a half of the room as shown in FIG. 7 (a) due to the birefringent anisotropy. While, the outdoor daylight shone almost on the entire room as shown in FIG. 7(b) when the liquid crystal aperture for adjusting light comprising a two-layer type obliquely evaporated film as shown in FIG. 6 is used.

EXAMPLE 3

In this Example 3, the liquid crystal aperture for adjusting light comprising a two-layer composition obliquely evaporated film was applied as one picture element to a dot matrix light transmission display device. In this display device, the display could be seen at various angles compared with a display device using a one-layer type obliquely evaporated film and therefore it enables many people to see the display at the same time.

Next, the manufacturing method of this invention will be described with reference to the following Examples 4 and 5.

EXAMPLE 4

Figure 8:
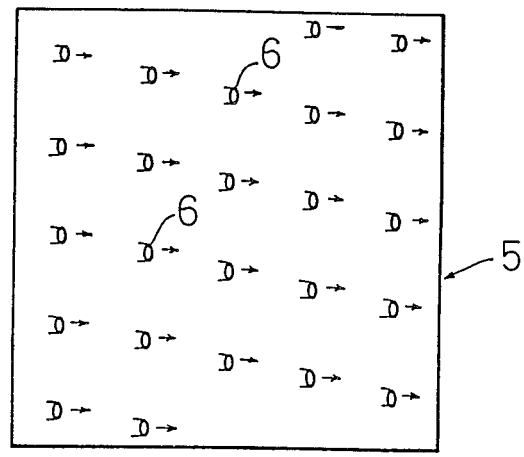
FIG. 8 is a schematic plan view of a crucible used in Examples 4 and 5.
Figure 9:
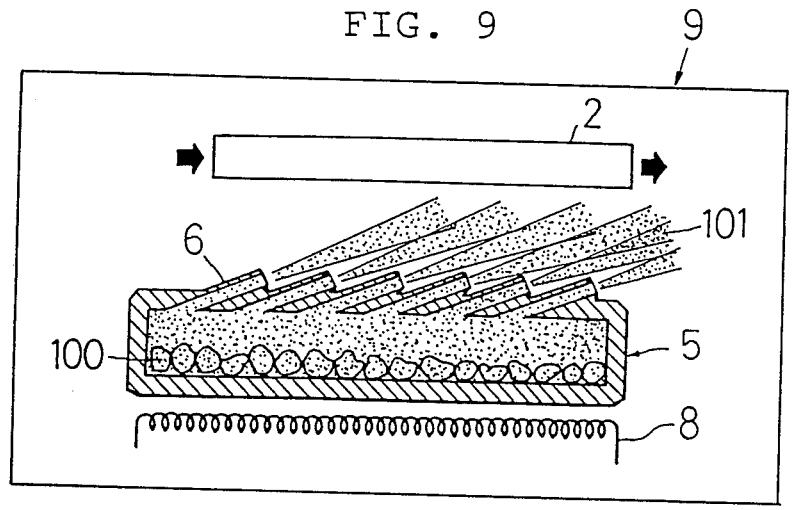
FIG. 9 is an explanatory view showing positional relationship between a crucible and substrate in Example 4.

FIG. 8 is a plan view showing a crucible having a large number of inclined through holes used in Examples 4 and 5, and FIG. 9 is an explanatory view showing the positional relationship between a crucible 5 and a substrate 2. In FIG. 8, arrows show the direction of evaportion material from the inclined through holes 6. As can be seen from FIG. 9, the upper part of the crucible 5 had inclined through holes 6 extending from down left to upper right. The inclination of each inclined through hole 6 was fixed at 70 to the normal of the upper surface of the crucible 5, while diameter and length of inclined through holes 6 were 1 mm and 5 mm respectively.

The crucible 5 was made of tantalum (Ta), however, metals with high melting point such as tungsten (W), graphite (C) and the like can also be used for making the crucible 5. The substrate 2 was placed movably in the horizontal direction at 50 mm away above the crucible 5. The crucible 5 and substrate 2 were placed within a vacuum chamber 9. A heater 8 for heating the crucible 5 (evaporation source) was placed in another vacum chamber (not shown). The heater 8 heats evaporation material, i.e., tungsten oxide ($WO_3$) 100.

The manufacturing method of this invention is performed with or without moving a substrate horizontally. In FIG. 9, first, the substrate 2 was moved horizontally in the direction shown by arrows, while tungsten oxide 100 in the crucible 5 was electronbeam heated (output 10 kv: 1A). Next, the tungsten oxide 100 became vapor 101 and reached to the lower surface of the substrate 2 at an angle of about 70° C. Thus, an obliquely evaporated film was formed on the surface. In this case, the portions of the substrate surface were kept 50 mm away from the upper part of the crucible 5, so that the obliquely evaporated film with uniform film thickness was obtained.

Even if the surface area of the substrate 2 was larger than the evaporation area of the crucible 5, the obliquely evaporated film could be formed on the whole surface of the substrate 2 because the substrate 2 was moved at a fixed speed.

While, a film forming speed was at 100 Å/sec in case the formation was carried out without moving the substrate 2.

The obliquely evaporated film is formed into a multilayer composition by varying the evaporation angle of each neighboring layer. For example in a two-layer composition, an upper layer is formed on a lower layer after varying the evaporation angle, or an upper layer is formed on a lower layer by replacing the crucible used for the lower layer with another crucible having a large number of through holes with a different inclination. Also, a two-layer composition is made by using two crucibles placed in the same vacuum chamber as described in Example 5.

In this example 4, tungsten oxide was used for evaporation material, however, it is possible to employ any material transparent to visible light, such as silicon dioxide ($SiO_2$), titanium oxide ($TiO_2$), yttria ($Y_2O_3$), tantalum pentoxide ($Ta_2O_5$), bismuth trioxide ($Bi_2O_3$), niobium pentoxide (Nb O), silicon monoxide (SiO), zinc sulfur (ZnS), cerium oxide ($CeO_2$), molybdenum oxide ($MoO_3$), tin dioxide ($SnO_2$) and the like.

EXAMPLE 5

Figure 10:
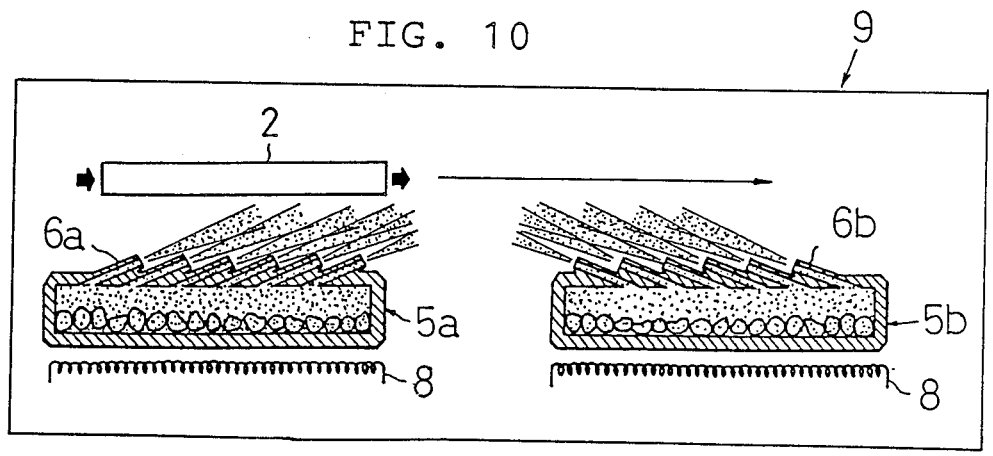
FIG. 10 is an explanatory view showing positional relationship between a crucible and substrate in Example 5.

FIG. 10 is an explanatory view of example 5. In this example 5, a multilayer composition birefringent plate comprising multi-layer type obliquely evaporated film with different evaporation directions was manufactured by the manufacturing method of this invention.

First, two crucibles (5a and 5b) were prepared within a vacuum chamber 9, one (5a) had inclined through holes 6a inclined in the upper right direction in the figure and the other (5b) had inclined through holes 6b inclined in the upper left direction in the figure. Then, a substrate 2 was moved horizontally over these two crucibles. Arrows show the moving direction of the substrate 2. A first layer was formed on the substrate 2 by evaporating an evaporation material of the crucible 5a, and then a second layer was formed on the first layer after the substrate 2 was moved horizontally to the crucible 5b. Thus, two layers of obliquely evaporated film with different growing directions of columnar structure were formed on the substrate 2. The film thickness of the obliquely evaporated film was uniform because the substrate 2 was moved in parallel with the crucibles.

In this manner, the birefringent plate with uniform thickness of obliquely evaporated film and without the visual angle dependence was obtained by the manufacturing method of this invention.

Having been fully described the invention, it will be apparent to one of ordinary skill in the art that many changes and modifications can be made thereto without departing from the spirit or scope of the invention as set forth herein.

What is claimed is:

1. A birefringent plate comprising a transparent substrate and an obliquely evaporated film formed on said transparent substrate by evaporating a dielectric material obliquely to the normal of said transparent substrate, wherein said obliquely evaporated film is composed of at least two layers, said two layers are formed by evaporating said dielectric material in evaporation directions differing from each other, and each of said two layers is composed of inclined columnar structures, the columnar structures of each layer being inclined at an angle differing from that of the columnar structures of the other layer, so as to reduce visual angle dependence.

2. A birefringent plate as claimed in claim 1, wherein said obliquely evaporated film is composed of an upper layer and a lower layer, and said evaporation directions of said dielectric material and inclinations of said columnar structures of said two layers are opposite each other and symmetrical with respect to the normal of said transparent substrate.

3. A birefringent plate as claimed in claim 2, wherein said lower layer is formed at an evaporation angle of about 70° to the normal of said transparent substrate, and said upper layer is formed at an evaporation angle of about 70° to the normal of said transparent substrate.

4. A birefringent plate as claimed in claim 1, wherein said transparent substrate is a glass substrate and said dielectric material is one selected from the group consisting of tungsten oxide, silicon dioxide, titanium oxide, yttria, tantalum pentoxide, niobium pentoxide, bismuth trioxide, silicon monoxide, zinc sulfur, molybdenum trioxide, cerium dioxide, and tin dioxide.

5. A birefringent plate as claimed in claim 1, wherein the film thickness of each of said layers is 500 Å or more.

6. A birefringent plate comprising:
(a) a transparent substrate having a planar surface; and
(b) a dielectric film formed on the transparent substrate for reducing visual angle dependence;
said film including
a lower layer of a dielectric material formed on the surface of the substrate and having columnar structures inclined obliquely at a first angle normal to the plane of the substrate;
an upper layer of a dielectric material formed on the lower layer, said upper layer having columnar structures inclined obliquely at a second angle normal to the plane of the substrate different than the first angle.

* * * * *